United States Patent
Chu

(10) Patent No.: US 9,721,669 B2
(45) Date of Patent: Aug. 1, 2017

(54) DATA PROTECTION METHOD, MEMORY CONTROL CIRCUIT UNIT AND MEMORY STORAGE APPARATUS

(71) Applicant: PHISON ELECTRONICS CORP., Miaoli (TW)

(72) Inventor: Chien-Hua Chu, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 169 days.

(21) Appl. No.: 14/887,332

(22) Filed: Oct. 20, 2015

(65) Prior Publication Data
US 2017/0052720 A1    Feb. 23, 2017

(30) Foreign Application Priority Data
Aug. 19, 2015    (TW) .............................. 104127020 A

(51) Int. Cl.
*G06F 12/00*    (2006.01)
*G11C 16/22*    (2006.01)
(Continued)

(52) U.S. Cl.
CPC ............ *G11C 16/22* (2013.01); *G11C 16/225* (2013.01); *G11C 16/32* (2013.01);
(Continued)

(58) Field of Classification Search
CPC .... G06F 3/0619; G06F 3/0659; G06F 3/0679; G06F 12/0688; G06F 12/0238; G06F 12/0646
USPC ..... 711/103, 154, 166; 709/221, 229; 710/7, 710/18, 23, 36, 58; 707/781, 787, 812; 715/2, 166, 340
See application file for complete search history.

(56) References Cited

U.S. PATENT DOCUMENTS 5,987,613 A * 11/1999 Busch .................. G06F 1/1616
                                                                713/300
7,082,529 B2 * 7/2006 Cantwell .............. G06F 9/4418
                                                                710/104
(Continued)

FOREIGN PATENT DOCUMENTS

TW    201518942    5/2015
TW    201519242    5/2015

OTHER PUBLICATIONS

"Office Action of Taiwan Counterpart Application," issued on Jan. 15, 2016, p. 1-p. 9.

*Primary Examiner* — Reba I Elmore
(74) *Attorney, Agent, or Firm* — Jianq Chyun IP Office

(57) ABSTRACT

A data protection method for a memory storage apparatus is provided. The method includes obtaining a current system time from a host system as a boot time, if the memory storage apparatus is powered on, and a basic input/output system of the host system loads and executes instruction programs in the expansion ROM of the memory storage apparatus for transmitting the current system time to the memory storage apparatus. The method also includes obtaining a shutdown time corresponding to the memory storage apparatus; calculating an off time from the shutdown time to the boot time and performing a refresh operation on physical erasing units of a rewritable non-volatile memory in the memory storage apparatus if the off time is longer than an off time threshold.

24 Claims, 8 Drawing Sheets

(51) Int. Cl.
*G11C 16/32* (2006.01)
*G11C 16/34* (2006.01)
G06F 3/06 (2006.01)
G06F 12/02 (2006.01)
G06F 12/06 (2006.01)

(52) U.S. Cl.
CPC ........ *G11C 16/3418* (2013.01); *G06F 3/0619* (2013.01); *G06F 3/0659* (2013.01); *G06F 3/0679* (2013.01); *G06F 3/0688* (2013.01); *G06F 12/0238* (2013.01); *G06F 12/0646* (2013.01)

(56) References Cited

U.S. PATENT DOCUMENTS

| | | | | |
|---|---|---|---|---|
| 2004/0215953 A1* | 10/2004 | Cantwell | ............... | G06F 9/4418 713/2 |
| 2006/0123223 A1* | 6/2006 | Mayfield | ............... | G06F 9/4403 713/2 |
| 2013/0258755 A1* | 10/2013 | Kollipara | ............... | G11C 11/401 365/149 |
| 2014/0013036 A1* | 1/2014 | Kwon | ............... | G11C 11/40615 711/103 |

* cited by examiner

DATA PROTECTION METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 104127020, filed on Aug. 19, 2015. The entirety of the above-mentioned patent application is hereby incorporated by reference herein and made a part of this specification.

BACKGROUND OF THE INVENTION

Field of the Invention

The present invention relates to a data protection method, and more particularly, relates to a data protection method adapted to a rewritable non-volatile memory and a memory control circuit unit and a memory storage apparatus using the same.

Description of Related Art

The growth of digital cameras, mobile phones, and MP3 players has been rapid in recent years. Consequently, the consumers' demand for storage media has increased tremendously. In recent years, a rewritable non-volatile memory has become an important part of the electronic industries because the rewritable non-volatile memory is capable of providing features such as data non-volatility, low power consumption, small volume, non-mechanical structure and high read/write speed. For instance, a solid-state drive utilizing a flash memory as a storage media has been widely applied in a computer host as a main hard disk for enhancing access efficiency of computer.

The rewritable non-volatile memory module normally includes a plurality of physical erasing units. After being accessed or idle for a long time, the data stored in the physical erasing units may be lost or has error bits, and therefore the memory storage apparatus usually performs a refresh operation on the physical erasing units of the rewritable non-volatile memory module at predefined intervals, so as to ensure data accuracy. However, the current memory storage apparatus is unable to know the duration from the previous power-off to the present power-on, and therefore unable to determine whether to need to perform the refresh operation accurately according to time. How to obtain the off time from the previous power-off to the present power-on so as to determine accurately when to perform the refresh operation is one of the major concerns of artisans in the technical field.

SUMMARY OF THE INVENTION

The present invention provides a data protection method, a memory control circuit unit, and a memory storage apparatus, so as to determine an off time of the memory storage apparatus accurately.

An exemplary embodiment of present the invention provides a data protection method for a memory storage apparatus. The memory storage apparatus includes a rewritable non-volatile memory module, the rewritable non-volatile memory module includes a plurality of physical erasing units. The data protection method includes: obtaining a current system time from a host system as a boot time if the memory storage apparatus is powered on, wherein a basic input/output system of the host system loads and executes instruction programs in an expansion ROM of the memory storage apparatus for transmitting the current system time to the memory storage apparatus. The data protection method also includes: obtaining a shutdown time corresponding to the memory storage apparatus. The data protection method also includes: calculating an off time from the shutdown time to the boot time. The data protection method also includes: performing a refresh operation on physical erasing units if the off time is longer than an off time threshold.

An exemplary embodiment of the present invention provides a memory control circuit unit which is configured in a memory storage apparatus for controlling a rewritable non-volatile memory module of the memory storage apparatus, wherein the rewritable non-volatile memory module comprises a plurality of physical erasing units. The memory control circuit unit includes a host interface, a memory interface, and a memory management circuit. The host interface is coupled to a host system, the memory interface is coupled to the rewritable non-volatile memory module, and the memory management circuit is coupled to the host interface and the memory interface. The memory management circuit obtains a current system time from the host system as a boot time if the memory storage apparatus is powered on, wherein a basic input/output system of the host system loads and executes instruction programs in an expansion ROM of the memory storage apparatus for transmitting the current system time to the memory storage apparatus. Furthermore, the memory management circuit obtains a shutdown time corresponding to the memory storage apparatus and calculates an off time from the shutdown time to the boot time. Additionally, the memory management circuit performs is a refresh operation on the physical erasing units if the off time is longer than an off time threshold.

An exemplary embodiment of the present invention provides a memory storage apparatus which includes a connection interface unit, a rewritable non-volatile memory module, and said memory control circuit unit. The connection interface unit is coupled to a host system. The rewritable non-volatile memory module includes a plurality of physical erasing units. The memory control circuit unit is coupled to the connection interface unit and the rewritable non-volatile memory module.

Based on the above, the exemplary embodiment of the invention provides the memory control circuit unit, the memory storage apparatus, and the data protection method applied to the memory control circuit unit and the memory storage apparatus, so as to determine the off time to perform the refresh operation accurately, to prevent data from being lost or error, and to achieve the effect that data is maintained.

In order to make the aforementioned and other features and advantages of the invention more comprehensible, embodiments accompanying figures are described in detail belows.

DESCRIPTION OF THE EMBODIMENTS

Figure 1:
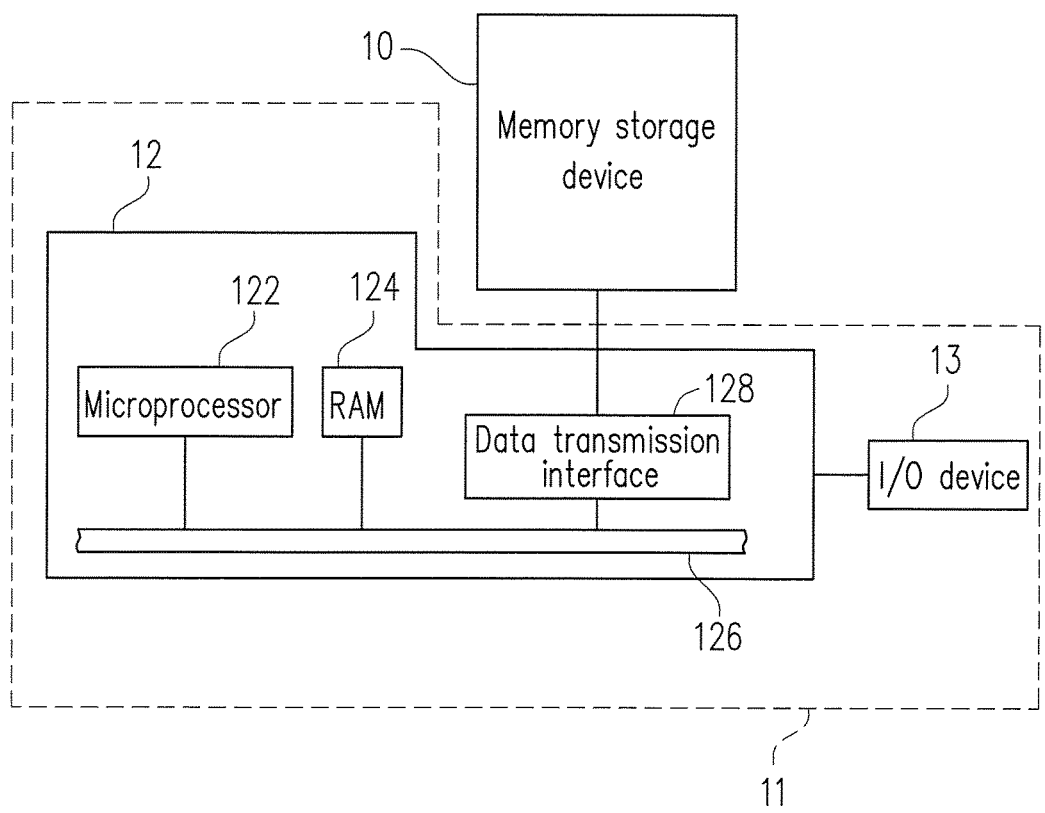
FIG. 1 is a schematic view depicting a host system and a memory storage apparatus according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage apparatus (also referred to as a memory storage system) includes a rewritable non-volatile memory module and a controller (also referred to as a control circuit). The memory storage apparatus is usually used together with a host system, such that the host system can write data into or read data from the memory storage apparatus.

Figure 2:
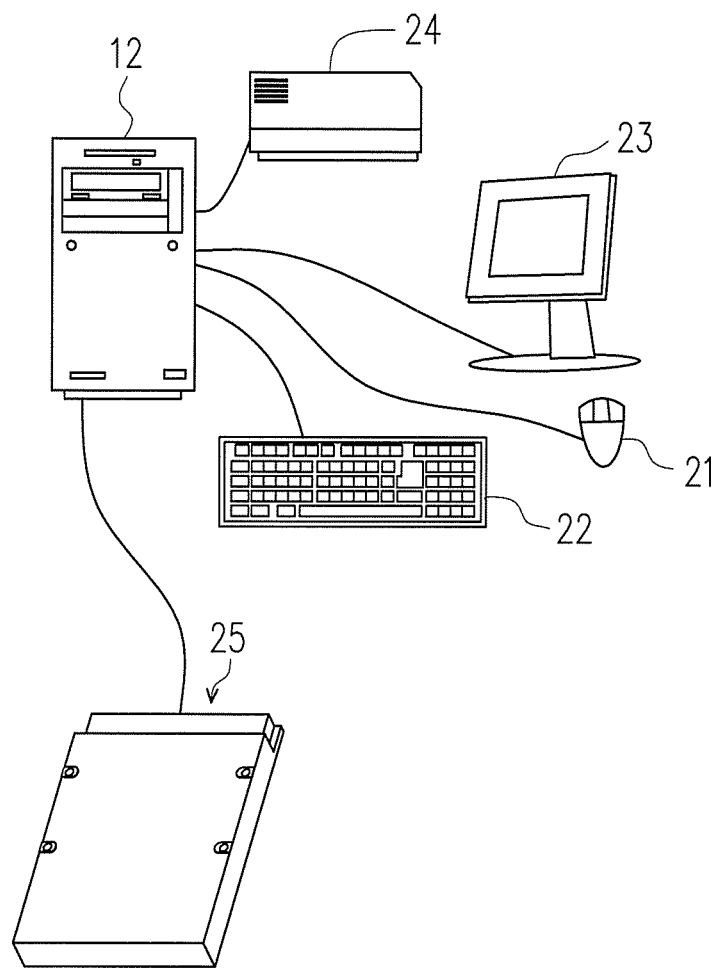
FIG. 2 is a schematic view depicting a computer, an input/output apparatus and a memory storage apparatus according to an exemplary embodiment.

FIG. 1 is a schematic view depicting a host system and a memory storage apparatus according to an exemplary embodiment, and FIG. 2 is a schematic view depicting a computer, an input/output apparatus and a memory storage apparatus according to an exemplary embodiment.

Referring to FIG. 1, generally, the host system 11 includes a computer 12 and an input/output (I/O) apparatus 13. The computer 12 includes a microprocessor 122, a random access memory (RAM) 124, a system bus 126, and a data transmission interface 128. The I/O apparatus 13 includes a mouse 21, a keyboard 22, a display 23, and a printer 24, as shown in FIG. 2. It should be understood that the I/O apparatus 13 is not limited to the devices illustrated in FIG. 2 and may further includes other devices.

In the present exemplary embodiment, the memory storage apparatus 10 is electrically connected to the devices of the host system 11 through the data transmission interface 128. Data can be written into or read from the memory storage apparatus 10 through the operations of the microprocessor 122, the RAM 124, and the I/O apparatus 13. For example, the memory storage apparatus 10 may be a solid state drive (SSD) 25 as shown in FIG. 2.

Figure 3:
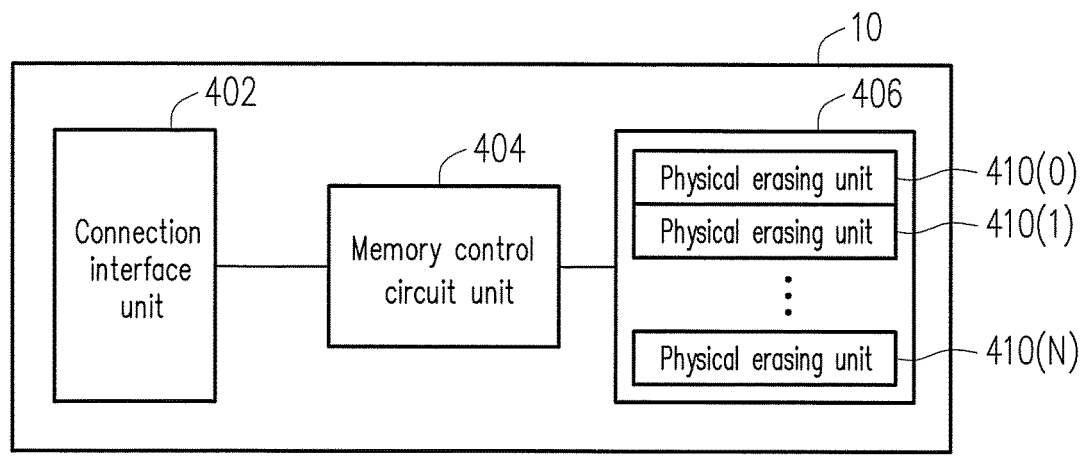
FIG. 3 is a schematic block diagram depicting a memory storage apparatus according to an exemplary embodiment.

FIG. 3 is a schematic block diagram depicting a memory storage apparatus according to an exemplary embodiment.

Referring to FIG. 3, the memory storage apparatus 10 includes a connection interface unit 402, a memory control circuit unit 404, a rewritable non-volatile memory module 406.

In the present exemplary embodiment, the connection interface unit 402 complies with the Peripheral Component Interconnect Express (PCI Express) standard. However, it should be understood that the present invention is not limited thereto, the connection interface unit 402 can also comply with the Peripheral Component Interconnect (PCI) standard or the Instruction Set Architecture (ISA) standard.

The memory control circuit unit 404 executes a plurality of logic gates or control instructions implemented in a hardware form or a firmware form and performs various data operations, such as writing, reading, and erasing operations, on the rewritable non-volatile memory module 406 according to commands issued by the host system 11.

The rewritable non-volatile memory module 406 is coupled to the memory control circuit unit 404 and configured to store data written by the host system 11. The rewritable non-volatile memory module 406 has physical erasing units 410(0)~410(N). For example, the physical erasing units 410(0)~410(N) may belong to the same memory die or different memory dies. Each of the physical erasing units respectively has a plurality of physical programming units, wherein the physical programming units belonging to the same physical erasing unit can be individually written and can be simultaneously erased. However, it should be understood that the invention is not limited thereto, and each of the physical erasing units may also be composed of 64, 256, or any other number of physical programming units.

To be more specific, the physical erasing unit is the smallest unit for erasing data. Namely, each of the physical erasing units contains the least number of memory cells that are erased all together. The physical programming unit is the smallest unit for programming data. Namely, the physical programming unit is the smallest unit for writing data. Each of the physical programming unit usually includes a data bit area and a redundant bit area. The data bit area contains a plurality of physical access addresses used for storing user data, and the redundant bit area is used for storing system data (for example, controlling information and error correcting codes). In the present exemplary embodiment, the data bit area of each of the physical programming units contains 8 physical access addresses, and the size of each physical access address is 512 bytes. However, in other exemplary embodiments, the number of physical access addresses in the data bit area can be greater or less, the invention is not limited to the number and size of the physical access addresses. For example, in the present exemplary embodiment, the physical erasing units are physical blocks, and the physical programming units are physical pages or physical sectors, but the present invention is not limited thereto.

In the present exemplary embodiment, the rewritable non-volatile memory module 406 is a single level cell (SLC) NAND flash memory module (namely, each memory cell can store one data bit of the flash memory module). However, the present invention is not limited thereto, the rewritable non-volatile memory module 406 may also be a multi level cell (MLC) NAND flash memory module (namely, each memory cell can store two data bits of the flash memory module), a trinary level cell (TLC) NAND flash memory module (namely, each memory cell can store three data bits of the flash memory module), any other suitable flash memory module, or any other memory module with the same characteristics.

Figure 4:
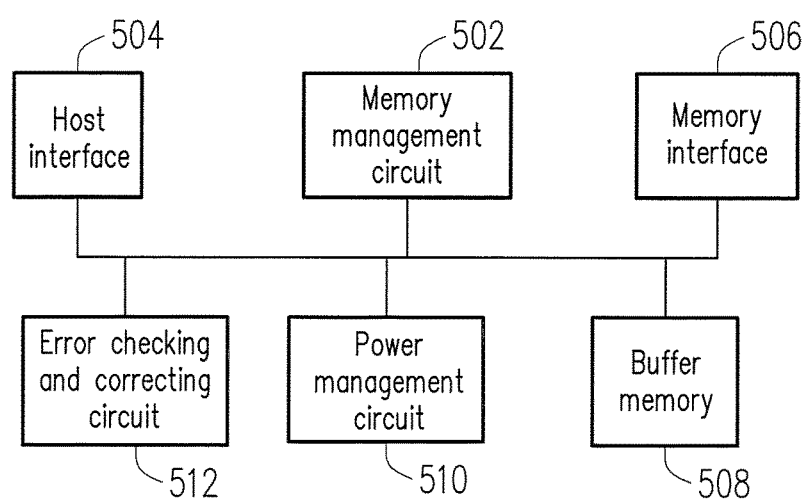
FIG. 4 is a schematic block diagram depicting a memory control circuit unit according to an exemplary embodiment.

FIG. 4 is a schematic block diagram depicting a memory control circuit unit according to an exemplary embodiment.

Referring to FIG. 4, the memory control circuit unit 404 includes a memory management circuit 502, a host interface 504, a memory interface 506, a buffer memory 508, a power management circuit 510, and an error checking and correcting circuit 512.

The memory management circuit 502 is configured to control the overall operation of the memory control circuit unit 404. To be specific, the memory management circuit 502 has a plurality of control instructions, and when the memory storage apparatus 10 is in operation, the control instructions are executed to perform data writing, data reading, and data erasing operations.

In the present exemplary embodiment, the control instructions of the memory management circuit 502 are implemented in a firmware form. For example, the memory management circuit 502 has a microprocessor unit (not shown) and a read-only memory (ROM, not shown), and the control instructions are burnt into the ROM. When the memory storage apparatus 10 is in operation, the control instructions are executed by the microprocessor unit to carry out data writing, data reading, and data erasing operations.

Figure 5:
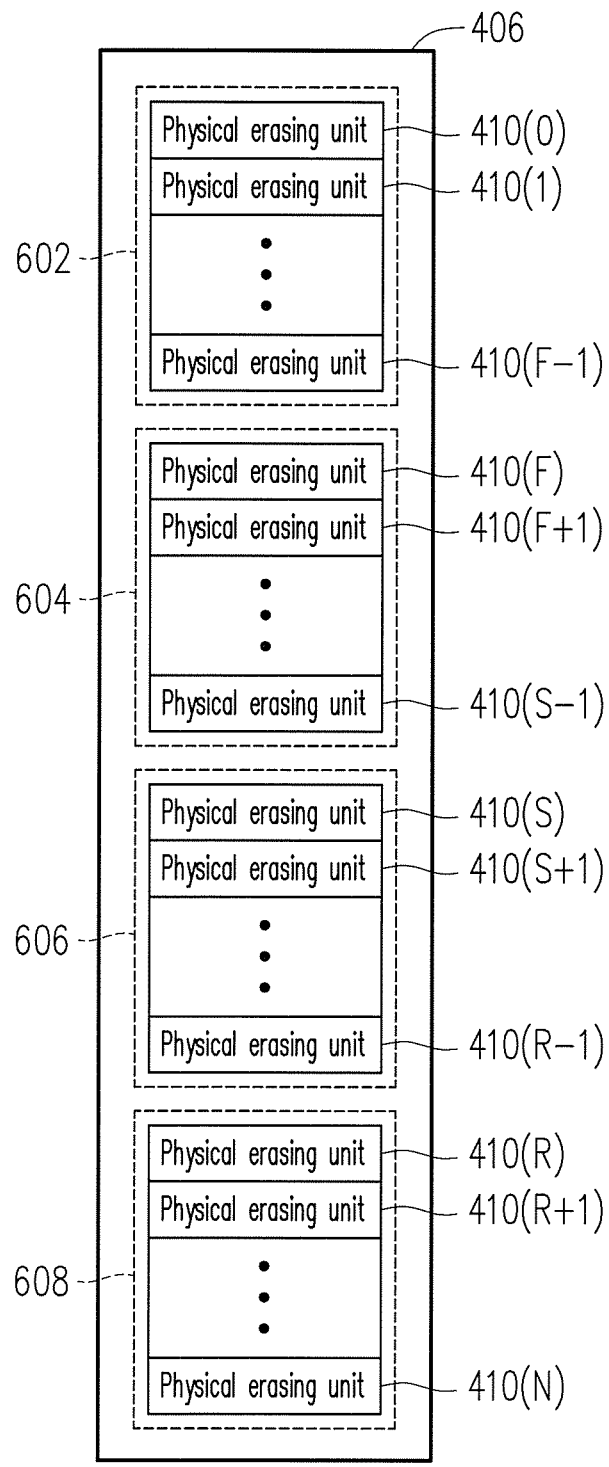
FIG. 5 and FIG. 6 are schematic views depicting an example of managing physical erasing units according to an exemplary embodiment.
Figure 6:
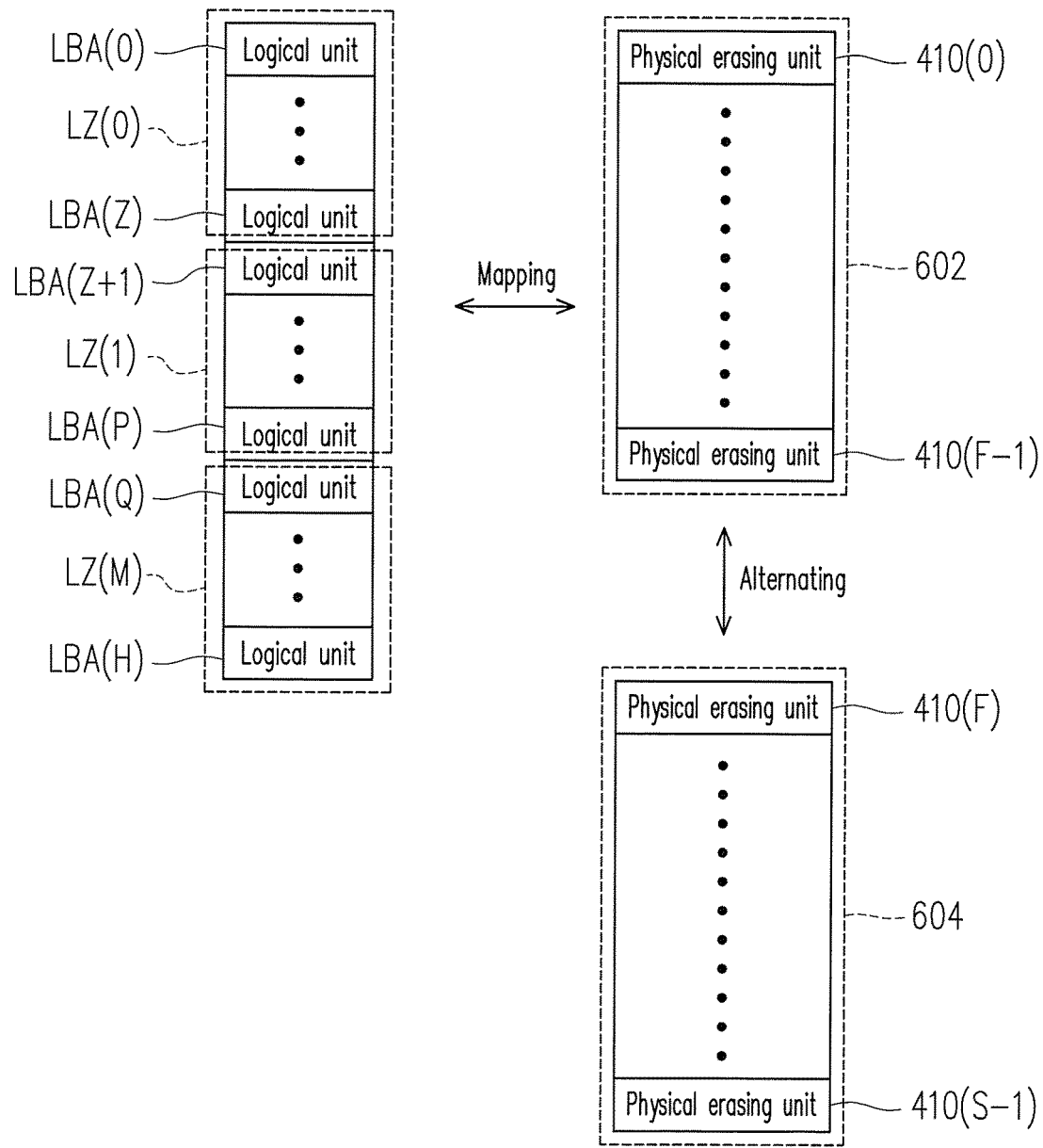

FIG. 5 and FIG. 6 are schematic views depicting an example of managing physical erasing units according to an exemplary embodiment.

It should be understood that the terms used herein for describing the operations (such as "retrieve", "group", "divide", and "associate") performed on the physical erasing units of the rewritable non-volatile memory module 106 refer to logical operations performed on these physical erasing units. In other words, the physical erasing units in the rewritable non-volatile memory module are only logically operated, and the actual positions of the physical erasing units are not changed.

Referring to FIG. 5, the memory control circuit unit 404 (or the memory management circuit 502) groups the physical erasing units 410(0)~410(N) logically into a data area 602, a spare area 604, a system area 606, and a replacement area 608.

The physical erasing units logically belonging to the data area 602 and the spare area 604 are configured to store data from the host system 11. Specifically, the physical erasing units belonging to the data area 602 are considered as physical erasing units where data is stored, and the physical erasing units belonging to the spare area 604 are configured to substitute the physical erasing units in the data area 602. In other words, when write commands and the data to be written are received from the host system 11, the memory management circuit 502 gets a physical erasing unit from the spare area 604 and writes the data into the gotten physical erasing unit for substituting the physical erasing unit in the data area 602.

The physical erasing units logically belonging to the system area 606 are configured to record the system data. For instance, the system data includes the manufacturers and models of the rewritable non-volatile memory module, the number of physical erasing units in the rewritable non-volatile memory module, the number of physical programming units in each physical erasing unit and so on.

The physical erasing units logically belonging to the replacement area 608 are configured to be used in the damaged physical erasing unit replacement procedure, so as to replace the damaged physical erasing units. Particularly, if there are still normal physical erasing units in the replacement area 608 and a physical erasing unit in the data area 602 is damaged, the memory management circuit 502 gets a normal physical erasing unit from the replacement area 608 to replace the damaged physical erasing unit.

Specifically, the numbers of the physical erasing units in the data area 602, the spare area 604, the system area 606, and the replacement area 608 are different according to different memory standards. In addition, it should be understood here, during the operation of the memory storage apparatus 10, the physical erasing units associated with the group relation of the data area 602, the spare area 604, the system area 606, and the replacement area 608 are dynamically changed. For example, when a physical erasing unit in the spare area 604 is damaged so as to be replaced by a physical erasing unit in the replacement area 608, the physical erasing unit originally in the replacement area 608 is then associated with the spare area 604.

Referring to FIG. 6, logical units LBA(0)~LBA(H) are configured in the memory control circuit unit 404 (or the memory management circuit 502) for mapping to the physical erasing units of the data area 602, wherein each of the logical units has a plurality of logical sub-units for mapping to the physical programming units of the corresponding physical erasing unit. In addition, when the host system 11 wants to write data into the logical units or to update data stored in the logical units, the memory control circuit unit 404 (or the memory management circuit 502) will retrieve a physical erasing unit in the spare area 604 to write data into, so as to substitute the physical erasing units in the data area 602. In the present exemplary embodiment, the logical unit may be a logical page or a logical sector.

In order to identify the physical erasing unit that each of the logical units are stored in, in the present exemplary embodiment, the memory control circuit unit 404 (or the memory management circuit 502) records the mapping between the logical units and the physical erasing units. In addition, when the host system 11 wants to access data in the logical sub-units, the memory control circuit unit 404 (or the memory management circuit 502) will identify the logical unit that the logical sub-units belong, and then access data in the physical erasing unit that the logical unit is mapped to. For example, in the present exemplary embodiment, the memory control circuit unit 404 (or the memory management circuit 502) stores a logical address-physical address mapping table in the rewritable non-volatile memory module 406 to the record the physical erasing unit that each of the logical units is mapped to, and the memory control circuit unit 404 (or the memory management circuit 502) loads the logical address-physical address mapping table into the buffer memory 508 to maintain when accessing data.

It is worth mentioning here, the capacity of the buffer memory 508 is limited and unable to store the mapping table recording all mapping relations of the logical units. Therefore, in the present exemplary embodiment, the memory control circuit unit 404 (or the memory management circuit 502) groups the logical units LBA(0)~LBA(H) into a plurality of logical zones LZ(0)~LZ(M), and one logical address-physical address mapping table is configured in each of the logical zones. Specifically, when the memory control circuit unit 404 (or the memory management circuit 502) updates the mapping of a logical unit, the logical address-physical address mapping table belonging to the logical zone corresponding to the logical unit is loaded into the buffer memory 508 and then to be updated.

In another exemplary embodiment of the present invention, the control instructions of the memory management circuit 502 may also be stored in a specific zone of the rewritable non-volatile memory module 406 (for example, a system area exclusively used for storing system data in a memory module) as program codes. Additionally, the memory management circuit 502 may have a micro-processor unit (not shown), a read-only memory (not shown), and a random access memory (not shown). In particular, the read-only memory (ROM) has a boot code segment, when the memory control circuit unit 404 is enabled, the microprocessor unit first executes the boot code segment to load the control instructions from the rewritable non-volatile memory module 406 into the random access memory (RAM) of the memory management circuit 502. Thereafter, the microprocessor unit runs the control instructions to perform various data operations such as writing, reading, and erasing.

In yet another exemplary embodiment, the control instructions of the memory management circuit 502 may also be implemented in a hardware form. For example, the memory management circuit 502 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is configured to manage the physical erasing units of the rewritable non-volatile memory module 406. The memory writing circuit is configured to issue a write command to the rewritable non-volatile memory module 406 to write data into the rewritable non-volatile memory module 406. The memory reading circuit is configured to issue a read command to the rewritable non-volatile memory module 406 to read data from the rewritable non-volatile memory module 406. The memory erasing circuit is configured to issue an erase command to the rewritable non-volatile memory module 406 to erase data from the rewritable non-volatile memory module 406. The data processing circuit is configured to process data to be written into and read from the rewritable non-volatile memory module 406.

Referring to FIG. 4, the host interface 504 is coupled to the memory management circuit 502 and configured to be coupled to the connection interface unit 402 so as to receive and to identify commands and data from the host system 11. Namely, commands and data transmitted by the host system 11 are transmitted to the memory management circuit 502 through the host interface 504. In the present exemplary embodiment, the host interface 504 complies with the PCI Express standard. However, it should be understood that the present invention is not limited thereto, and the host interface 504 may also comply with the PCI standard, the ISA standard, or any other suitable data transmission standard.

The memory interface 506 is coupled to the memory management circuit 502 and configured to access the rewritable non-volatile memory module 406. Namely, data to be written into the rewritable non-volatile memory module 406 is converted by the memory interface 506 into a format acceptable to the rewritable non-volatile memory module 406.

The buffer memory 508 is coupled to the memory management circuit 502 and configured to temporarily store data and commands from the host system 11 or data from the rewritable non-volatile memory module 406.

The power management circuit 510 is coupled to the memory management circuit 502 and configured to control the power supply of the memory storage apparatus 10.

The error checking and correcting circuit 512 is coupled to the memory management circuit 502 and configured to execute an error checking and correcting procedure to ensure data accuracy. To be specific, when the memory management circuit 502 receives a write command from the host system 11, the error checking and correcting circuit 512 generates a corresponding error checking and correcting code (ECC code) for the data corresponding to the write command, and the memory management circuit 502 writes the data corresponding to the write command and the corresponding ECC code into the rewritable non-volatile memory module 406. Subsequently, when the memory management circuit 502 reads the data from the rewritable non-volatile memory module 406, it also reads the ECC code corresponding to the data, and the error checking and correcting circuit 512 executes the error checking and correcting procedure on the read data according to the error checking and correcting code.

If the host system 11 is booted up, power is supplied for the memory storage apparatus 10 coupled to the host system 11, so as to have the memory storage apparatus 10 electrified (powered on). In addition, if booting up, the host system 11 scans the expansion ROM of the memory storage apparatus 10 via its own basic input/output system (BIOS) to read the instruction programs stored in the expansion ROM, so as to load and then to execute the instruction programs. In the present exemplary embodiment, a part of the storage space of the rewritable non-volatile memory module 406 is divided to serve as the expansion ROM. However, it should be understood here, the present invention is not limited thereto, in one exemplary embodiment, other memory modules are configured in the memory storage apparatus 10 to serve as the expansion ROM. The instruction programs stored in the expansion ROM can include an instruction program that requests the host system to return its own current system time. Based on the above, if the host system 11 is booted up to make the memory storage apparatus 10 power on, the host system 11 loads and executes instruction programs in the expansion ROM via the basic input/output system, so as to transmit the current system time of the host system 11 to the memory storage apparatus 10. The memory storage apparatus 10 can use the current system time received from the host system 11 as a boot time, and then store in the physical erasing units in the rewritable non-volatile memory module 406 (such as, the physical erasing units in the system area 606).

In contrast, if the couple relationship between the memory storage apparatus 10 and the host system 11 is eliminated, or after the host system is shut down, power supplied for the memory storage apparatus 10 is cut off, so as to make the memory storage apparatus 10 power off. Generally, the memory storage apparatus 10 usually executes the data storage operation if being powered off Based on the above, if the memory storage apparatus 10 is powered on, the memory control circuit unit 404 (or the memory management circuit 502) obtains the time stored before power-off from the stored data as a shutdown time.

In the present exemplary embodiment, the memory storage apparatus 10 stores data into one of physical erasing units of the rewritable non-volatile memory module 406 before power-off, and if the memory storage apparatus 10 is powered on, the time, which is stored before power-off, is obtained from the data stored in the physical erasing units as the shutdown time. For example, before power-off, the memory storage apparatus 10 restores the logical address-physical address mapping table recording the mapping relation between the logical units and the physical erasing units from the buffer memory 508 to the physical erasing units of the rewritable non-volatile memory module 406, and the restoring time is recorded in the logical address-physical address mapping table. After that, if the memory storage apparatus 10 is powered on again after power-off, the memory storage apparatus 10 obtains the shutdown time from the data stored in the logical address-physical address mapping table before power-off Obtaining the shutdown time from the data stored in the logical address-physical address mapping table is only one of the embodiments, in other exemplary embodiments, the shutdown time is also obtained from other data stored before power-off, the present invention is not limited thereto.

As described above, if the memory storage apparatus 10 is powered on, the memory control circuit unit 404 (or the memory management circuit 502) can obtain the boot time corresponding to the current power-on via the host system 11, and obtain the shutdown time corresponding to the previous power-off via the stored data, and then calculate an off time (the power-off time) from the shutdown time to the boot time.

In the present exemplary embodiment, the memory control circuit unit 404 (or the memory management circuit 502) further determines whether the calculated off time is longer than the off time threshold. Herein, the off time threshold may be set as a specific time according to the type of the rewritable non-volatile memory module 406, such as three months, or one year, or other settings, the present invention is not limited thereto. Specifically, the calculated off time being longer than the off time threshold represents that the memory storage apparatus 10 is not used for a long time, the data stored in the rewritable non-volatile memory module 406 may be damaged or contain error bits. At this time, the memory control circuit unit 404 (or the memory management circuit 502) performs the refresh operation on the physical erasing units of the rewritable non-volatile memory module 406.

If the calculated off time is not longer than the off time threshold, the memory control circuit unit 404 (or the memory management circuit 502) may calculate a total off time of the memory storage apparatus 10 according to the off time. To be more specific, the memory control circuit unit 404 (or the memory management circuit 502) adds the off times which are not longer than the off time threshold so as to calculate the total off time of the memory storage apparatus 10. In other words, the memory control circuit unit 404 (or the memory management circuit 502) obtains the total off time previously recorded and calculate the sum of the off time and the total off time. If the sum of the off time and the total off time previously recorded is not longer than the off time threshold, the total off time is updated as the sum of the off time and the total off time previously recorded. In the present exemplary embodiment, the total off time may be stored in one of the physical erasing units of the rewritable non-volatile memory module 406. For example, the total off time may be stored in the physical erasing unit in the system area 606 of the rewritable non-volatile memory module 406. On the other hand, if the sum of the off time and the total off time previously recorded is longer than the off time threshold, the memory control circuit unit 404 (or the memory management circuit 502) performs the refresh operation on the physical erasing units of the rewritable non-volatile memory module 406. To be more specific, the memory control circuit unit 404 (or the memory management circuit 502) performs the refresh operation on the physical erasing units, in which the valid data is stored, of the rewritable non-volatile memory module 406. In the present exemplary embodiment, the memory control circuit unit 404 (or the memory management circuit 502) may reset the total off time (for example, the total off time is reset to 0) after performing the refresh operation. For example, the memory control circuit unit 404 (or the memory management circuit 502) resets the total off time after performing the refresh operation if the off time is longer than the off time threshold or the total off time is longer than the off time threshold.

In the present exemplary embodiment, the memory control circuit unit 404 (or the memory management circuit 502) uses the off time and the total off time simultaneously to determine whether to perform the refresh operation. In the present exemplary embodiment, the memory control circuit unit 404 (or the memory management circuit 502) may determine whether to perform the refresh operation according to only the off time calculated in each time of power on, and the total off time is not calculated.

Besides determining whether to perform the refresh operation according to the off time or the total off time, the memory control circuit unit 404 (or the memory management circuit 502) may continue to record the refresh operation interval time after performing the refresh operation. If the refresh operation interval time is longer than the interval time threshold, the refresh operation is performed. The refresh operation interval time is an interval time from completing the present refresh operation to executing the next refresh operation. Here, the interval time threshold may be set as a specific time according to the type of the rewritable non-volatile memory module 406, such as one week, or other settings, the present invention is not limited thereto. In addition, the refresh operation interval time may also be stored in the physical erasing unit in the system area 606 of the rewritable non-volatile memory module 406.

The following will describe how to perform the refresh operation on the physical erasing units 410(0)~410(N) of the rewritable non-volatile memory module 406.

To be more specific, the memory control circuit unit 404 (or the memory management circuit 502) gives a read command sequence to read the valid data of each of the physical erasing units 410(0)~410(N), and the ECC code is used to check the valid data of each of the physical erasing units 410(0)~410(N) so as to calculate the number of error bits of the valid data. If the number of error bits of the valid data of the first physical erasing unit is greater than the predetermined error bit number threshold, the memory control circuit unit 404 (or the memory management circuit 502) copies the valid data into an empty physical erasing unit. After copying the valid data to the empty physical erasing unit, the memory control circuit unit 404 (or the memory management circuit 502) updates the logical address-physical address mapping table, so as to remap the logical unit, which the copied valid data belongs, to the physical erasing unit. To be more specific, the memory control circuit unit 404 (or the memory management circuit 502) uses the ECC code for performing correction on the read valid data having error bits, and then copies the valid data after correction into an empty physical erasing unit, so as to complete the refresh operation. In the present exemplary embodiment, the memory control circuit unit 404 (or the memory management circuit 502) may get one empty physical erasing unit from the spare area 604 so as to copy the valid data after correction into the empty physical erasing unit. In another exemplary embodiment, the memory control circuit unit 404 (or the memory management circuit 502) may temporarily store the valid data after correction in the buffer memory 508, and perform an erasing procedure on the physical erasing unit in which the valid data is stored, and then to program the valid data after correction in the buffer memory 508 into the physical erasing unit that has been completely erased.

Figure 7:
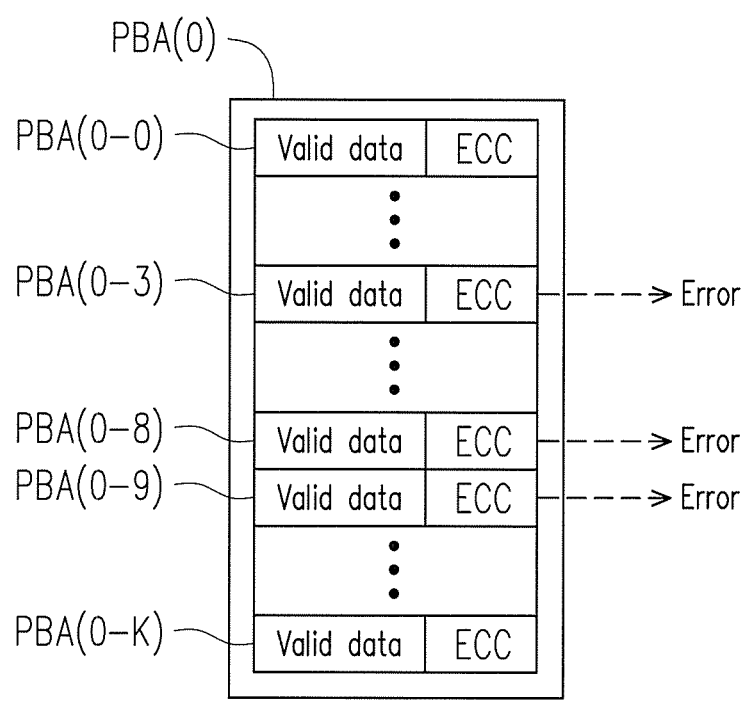
FIG. 7 is a schematic view depicting examining and calculating error bits of a valid data of a physical erasing unit according to an exemplary embodiment.

FIG. 7 is a schematic view depicting examining and calculating error bits of a valid data of a physical erasing unit according to an exemplary embodiment.

Referring to FIG. 7, the physical erasing unit PBA(0) includes a plurality of physical programming units PBA(0-0)~PBA(0-K), each of the physical programming units includes a data bit area and a redundant bit area. The data bit area is used for storing the valid data, and the redundant bit area is used for storing ECC code corresponding to the valid data. When the memory control circuit unit 404 (or the memory management circuit 502) performs is the refresh operation on the physical erasing unit PBA(0), the memory control circuit unit 404 (or the memory management circuit 502) issues a read command sequence to read the valid data and the corresponding ECC code of the physical programming unit PBA(0-0)~PBA(0-K) sequentially, and the error checking and correcting circuit 512 uses the ECC code to check whether the valid data has error, so as to calculate the number of error bits of the valid data.

In the present exemplary embodiment, the memory control circuit unit 404 (or the memory management circuit 502) may check to show that the number of error bits of the stored valid data existed in at least a specific number of the physical programming units in the physical erasing unit PBA(0) is greater than a predetermined error bit number threshold, so as to determine the need to copy the valid data in the physical erasing unit PBA(0) into another physical erasing unit. In contrast, if it is checked that the number of error bits of the stored valid data existed in at least a specific number of the physical programming units in the physical erasing unit PBA(0) is not greater than a predetermined error bit number threshold, in other words, in the physical erasing unit PBA(0), the number of the physical programming units which have a greater number of error bits of the stored valid data than the predetermined error bit number threshold is smaller than the specific number, so that there is no need to copy the valid data in the physical erasing unit PBA(0) into another physical erasing unit. The specific number may be greater than or smaller than 1. For example, if it is checked to show that the number of error bits of the stored valid data existed in at least a physical programming unit is greater than the predetermined error bit number threshold, there is a need to copy the valid data of the first physical erasing unit into another physical erasing unit (namely, the second physical erasing unit). Therefore, if the physical programming unit PBA(0-3) is sequentially checked to discover that the number of error bits of the stored valid data is greater than the predetermined error bit number threshold, there is a need to copy the valid data of the physical erasing unit PBA(0) into another physical erasing unit. In contrast, after the physical programming units PBA(0-0)~PBA(0-K) are sequentially checked, if the number of error bits of the stored valid data is greater than the predetermined error bit number threshold (i.e., the numbers of error bits of the stored valid data in each of the physical programming units of the physical erasing unit PBA(0) all are not greater than the predetermined error bit number threshold), there is no need to copy the valid data in the physical erasing unit PBA(0) into another physical erasing unit (namely, the second physical erasing unit).

However, in another embodiment, the memory control circuit unit 404 (or the memory management circuit 502) calculates an average value of the number of error bits of the valid data that generates error after the stored valid data in the physical programming units PBA(0-0)~PBA(0-K) of the physical erasing unit PBA(0) is completely examined. If the average value is greater than the predetermined error bit number threshold, it is determined to copy the valid data of the physical erasing unit PBA(0) into another physical erasing unit. In contrast, if the average value is not greater than the predetermined error bit number threshold, it not determined to copy the valid data of the physical erasing unit PBA(0) into another physical erasing unit (namely, the second physical erasing unit). For example, the memory control circuit unit 404 (or the memory management circuit 502) examines the stored valid data in the physical programming units PBA(0-0)~PBA(0-K) of the physical erasing unit PBA(0), and identify that error bits occur in the valid data stored in the physical programming units PBA(0-3), PBA(0-8), and PBA(0-9). Therefore, the memory control circuit unit 404 (or the memory management circuit 502) calculates the average value of the number of error bits of the valid data stored in the physical programming units PBA(0-3), PBA(0-8), and PBA(0-9). If the average value is greater than the predetermined error bit number threshold, it is determined to copy the valid data of the physical erasing unit PBA(0) into another physical erasing unit. In contrast, if the average value is not greater than the predetermined error bit number threshold, it not determined to copy the valid data of the physical erasing unit PBA(0) into another physical erasing unit (namely, the second physical erasing unit).

In the present exemplary embodiment, the predetermined error bit number threshold may be set to be smaller than an upper limit of the number of correctable error bits by an ECC code. For example, the upper limit of the number of the correctable error bits is 40 bits, in other words, the maximum error bits that can be corrected by the ECC code is 40, the predetermined error bit number threshold may further be set as 35 bits, so as to prevent the number of error bits of the valid data from exceeding the upper limit of the number of correctable error bits to cause reading failure problem.

In the present exemplary embodiment, the memory control circuit unit 404 (or the memory management circuit 502) performs the refresh operation on the physical erasing units, in which the valid data is stored, of the rewritable non-volatile memory module 406. However, in another embodiment, the memory control circuit unit 404 (or the memory management circuit 502) may only perform the refresh operation on some physical erasing units of the physical erasing units, in which the valid data is stored, of the rewritable non-volatile memory module 406, the present invention is not limited thereto. For example, the memory control circuit unit 404 (or the memory management circuit 502) may perform the refresh operation on the physical erasing units in the data area 602 and the system area 606 simultaneously, or, may only perform the refresh operation on the physical erasing units in the data area 602 or the system area 606.

Figure 8:
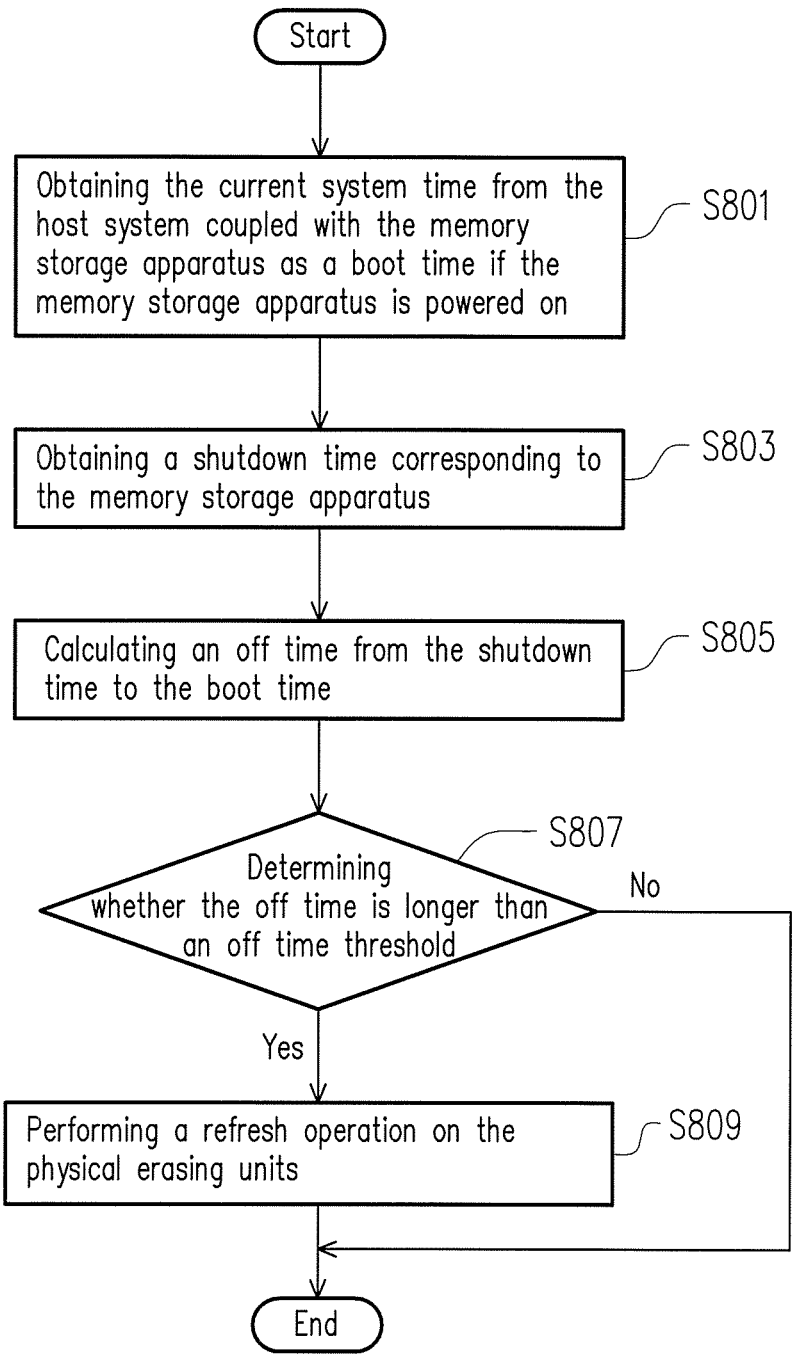
FIG. 8 is a flowchart depicting a data protection method according to an exemplary embodiment.

FIG. 8 is a flowchart depicting a data protection method according to an exemplary embodiment.

Referring to FIG. 8, in Step S801, if the memory storage apparatus 10 is powered on, the memory control circuit unit 404 (or the memory management circuit 502) obtains the current system time from the host system 11, which is coupled with the memory storage apparatus 10, as a boot time. In the present exemplary embodiment, the basic input/output system of the host system 11 loads and executes instruction programs in the expansion ROM of the memory storage apparatus 10, and the host system 11 transmits the current system time to the memory storage apparatus 10.

In Step S803, the memory control circuit unit 404 (or the memory management circuit 502) obtains the shutdown time corresponding to the memory storage apparatus 10. In the present exemplary embodiment, the shutdown time is recorded in the logical address-physical address mapping table before the memory storage apparatus 10 is previously powered off. Hence, if the memory storage apparatus 10 is powered on, the shutdown time may be obtained from the logical address-physical address mapping table.

In Step S805, the memory control circuit unit 404 (or the memory management circuit 502) calculates the off time from the shutdown time to the boot time.

In Step S807, the memory control circuit unit 404 (or the memory management circuit 502) determines whether the off time is longer than the off time threshold.

If the off time is longer than the off time threshold, in Step S809, the memory control circuit unit 404 (or the memory management circuit 502) performs the refresh operation on the physical erasing units of the rewritable non-volatile memory module 406 in the memory storage apparatus 10.

Figure 9:
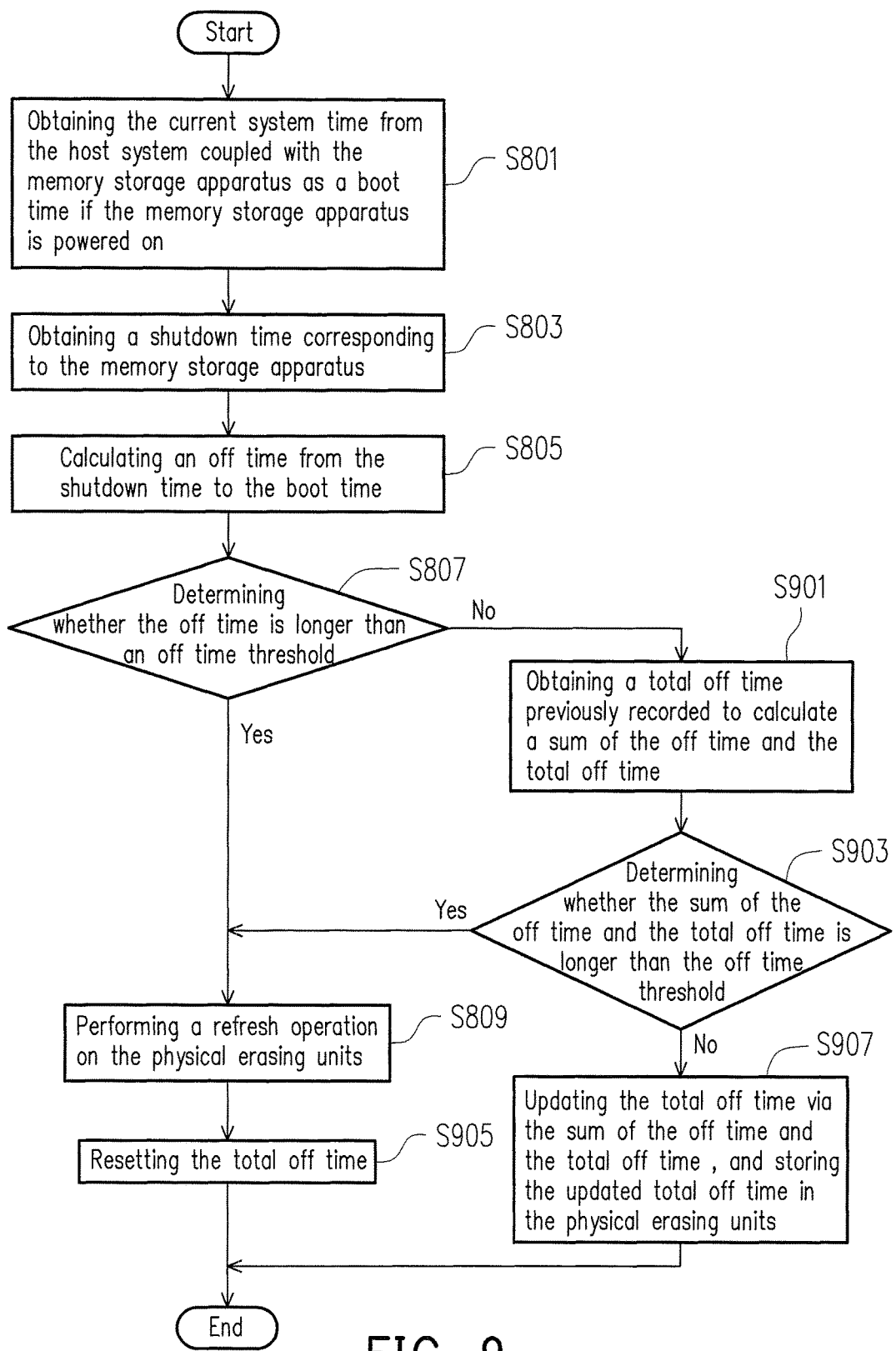
FIG. 9 is a flowchart depicting a data protection method according to another exemplary embodiment.

FIG. 9 is a flowchart depicting a data protection method according to another exemplary embodiment.

Referring to FIG. 9, wherein, Steps S801~S809 are similar to Steps in FIG. 8, and will not be repeated. The parts different from the embodiment in FIG. 8 are described as following.

In Step S807 of the present exemplary embodiment, the memory control circuit unit 404 (or the memory management circuit 502) determines whether the off time is longer than the off time threshold. If the off time of the memory storage apparatus 10 is not longer than the off time threshold, in Step S901, the memory control circuit unit 404 (or the memory management circuit 502) obtains a total off time previously recorded to calculate a sum of the off time and the total off time.

In Step S903, the memory control circuit unit 404 (or the memory management circuit 502) determines whether the sum of the off time and the total off time is longer than the off time threshold.

If the sum of the off time and the total off time is longer than the off time threshold, Step S809 is performed, the memory control circuit unit 404 (or the memory management circuit 502) performs the refresh operation on the physical erasing units 410(0)~410(N) of the rewritable non-volatile memory module 406 in the memory storage apparatus 10. After performing the refresh operation, in Step S905, the memory control circuit unit 404 (or the memory management circuit 502) resets the total off time.

If the sum of the off time and the total off time is not longer than the off time threshold, in Step S907, the memory control circuit unit 404 (or the memory management circuit 502) updates the total off time via the sum of the off time and the total off time, and stores the updated total off time in at least one of the physical erasing units of the rewritable non-volatile memory module 406. In the present exemplary embodiment, the total off time may be stored in the physical erasing units of the system area of the rewritable non-volatile memory module 406.

It is worth mentioning here, in the present exemplary embodiment, the off time and the total off time are accorded to determine whether to perform the refresh operation, the total off time is recalculated after performing the refresh operation in Step S809, so that the memory control circuit unit 404 (or the memory management circuit 502) resets total off time. Therefore, the difference form the exemplary embodiment in FIG. 8 is that if the off time calculated in present is determined to be longer the off time threshold, the memory control circuit unit 404 (or the memory management circuit 502) will perform the refresh operation in Step S809, and then perform Step S905 to reset the total off time after the refresh operation is performed.

The Steps in FIG. 8 and FIG. 9 that the refresh operation is performed on the physical erasing units in the rewritable non-volatile memory module 406 of the memory storage apparatus 10 are described in the previous embodiment, and therefore will not be repeated.

In summary, the off time (the power-off time) of the memory storage apparatus accurately are calculated, and whether to perform the refresh operation is determined according to the off time. Therefore, the circumstances that data is lost or error could be effectively prevented, so as to achieve the effect that the data stored in the memory storage apparatus is maintained.

Although the present invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A data protection method, for a memory storage apparatus comprising a rewritable non-volatile memory module having a plurality of physical erasing units, the data protection method comprising:
    obtaining a current system time from a host system as a boot time if the memory storage apparatus is powered on, wherein a basic input/output system of the host system loads and executes instruction programs in an expansion ROM of the memory storage apparatus for transmitting the current system time to the memory storage apparatus;
    obtaining a shutdown time corresponding to the memory storage apparatus;
    calculating an off time from the shutdown time to the boot time; and
    performing a refresh operation on physical erasing units if the off time is longer than an off time threshold.

2. The data protection method as recited in claim 1, further comprising:
    obtaining a total off time previously recorded and calculating a sum of the off time and the total off time if the off time is not longer than the off time threshold;
    performing the refresh operation on the physical erasing units if the sum of the off time and the total off time is longer than the off time threshold; and
    resetting the total off time after performing the refresh operation on the physical erasing units.

3. The data protection method as recited in claim 2, further comprising:
    updating the total off time via the sum of the off time and the total off time if the sum of the off time and the total off time is not longer than the off time threshold, and storing the updated total off time in at least one of the physical erasing units.

4. The data protection method as recited in claim 1, further comprising:
    continuing to record a refresh operation interval time after performing the refresh operation on the physical erasing units; and
    performing the refresh operation on physical erasing units if the refresh operation interval time is longer than an interval time threshold.

5. The data protection method as recited in claim 1, wherein the step of performing the refresh operation on physical erasing units comprise:

checking and calculating a number of error bits of valid data stored in a first physical erasing unit among the physical erasing units;

copying the valid data of the first physical erasing unit into a second physical erasing unit of the physical erasing units if the number of error bits of the valid data of the first physical erasing unit is greater than a predetermined error bit number threshold; and non-copying the valid data of the first physical erasing unit into the second physical erasing unit of the physical erasing units if the number of error bits of the valid data of the first physical erasing unit is not greater than the predetermined error bit number threshold.

6. The data protection method as recited in claim 5, wherein the physical erasing units belong to a system area of the rewritable non-volatile memory module.

7. The data protection method as recited in claim 1, further comprising:

recording the shutdown time in one of the physical erasing units of the rewritable non-volatile memory module, wherein the shutdown time is recorded before the memory storage apparatus is powered off.

8. The data protection method as recited in claim 7, wherein the step of obtaining the shutdown time corresponding to the memory storage apparatus comprise:

reading the shutdown time from the one of the physical erasing units of the rewritable non-volatile memory module if the memory storage apparatus is powered on.

9. A memory control circuit unit, disposed in a memory storage apparatus, for controlling a rewritable non-volatile memory module of the memory storage apparatus, wherein the rewritable non-volatile memory module comprises a plurality of physical erasing units, the memory control circuit unit comprising:

a host interface configured to couple to a host system;

a memory interface configured to couple to the rewritable non-volatile memory module; and a memory management circuit coupled to the host interface and the memory interface, wherein the memory management circuit is configured to obtain a current system time from the host system as a boot time if the memory storage apparatus is powered on, wherein a basic input/output system of the host system loads and executes instruction programs in an expansion ROM of the memory storage apparatus for transmitting the current system time to the memory storage apparatus, wherein the memory management circuit is further configured to obtain a shutdown time corresponding to the memory storage apparatus, wherein the memory management circuit is further configured to calculate an off time from the shutdown time to the boot time, wherein the memory management circuit is further configured to perform a refresh operation on the physical erasing units if the off time is longer than an off time threshold.

10. The memory control circuit unit as recited in claim 9, wherein the memory management circuit is further configured to obtain a total off time previously recorded and to calculate a sum of the off time and the total off time if the off time is not longer than the off time threshold, wherein the memory management circuit is further configured to perform the refresh operation on the physical erasing units if the sum of the off time and the total off time is longer than the off time threshold, wherein the memory management circuit is further configured to reset the total off time after performing the refresh operation on the physical erasing units.

11. The memory control circuit unit as recited in claim 10, wherein the memory management circuit is further configured to update the total off time via the sum of the off time and the total off time if the sum of the off time and the total off time is not longer than the off time threshold, and to store the updated total off time in at least one of the physical erasing units.

12. The memory control circuit unit as recited in claim 9, wherein the memory circuit is further configured to continue to record a refresh operation interval time after performing the refresh operation on the physical erasing units; and, wherein the memory management circuit is further configured to perform the refresh operation on physical erasing units if the refresh operation interval time is longer than an interval time threshold.

13. The memory control circuit unit as recited in claim 9, further comprising an error checking and correcting circuit coupled to the memory management circuit, wherein the memory management circuit is configured to give a read command sequence to read valid data stored in a first physical erasing unit of the physical erasing units, and the valid data of the first physical erasing unit is checked by the error checking and correcting circuit, wherein the memory management circuit is further configured to calculate a number of error bits of the valid data of the first physical erasing unit, wherein the memory management circuit is further configured to copy the valid data of the first physical erasing unit into a second physical erasing unit of the physical erasing units if the number of error bits of the valid data of the first physical erasing unit is greater than a predetermined error bit number threshold, wherein the memory management circuit does not copy the valid data of the first physical erasing unit into the second physical erasing unit of the physical erasing units if the number of error bits of the valid data of the first physical erasing unit is not greater than the predetermined error bit number threshold.

14. The memory control circuit unit as recited in claim 13, wherein the physical erasing units belong to a system area of the rewritable non-volatile memory module.

15. The memory control circuit unit as recited in claim 9, wherein the memory management circuit is further configured to record the shutdown time in one of the physical erasing units of the rewritable non-volatile memory module, wherein the shutdown time is recorded before the memory storage apparatus is powered off.

16. The memory control circuit unit as recited in claim 15, wherein the memory management circuit is further configured to read the shutdown time from the one of the physical erasing units of the rewritable non-volatile memory module if the memory storage apparatus is powered on.

17. A memory storage apparatus, comprising:

a connection interface unit configured to couple to a host system;

a rewritable non-volatile memory module comprising a plurality of physical erasing units, wherein each of the physical erasing units has a plurality of physical programming units; and a memory control circuit unit coupled to the connection interface unit and the rewritable non-volatile memory module, wherein the memory control circuit unit obtains a current system time from the host system as a boot time if the memory storage apparatus is powered on, wherein a basic input/output system of the host system loads and executes instruction programs in an expansion ROM of the memory storage apparatus for transmitting the current system time to the memory storage apparatus, wherein the memory control circuit unit is further configured to obtain a shutdown time corresponding to the memory storage apparatus, wherein the memory control circuit unit is further configured to calculate an off time from the shutdown time to the boot time, wherein the memory control circuit unit is further configured to perform a refresh operation on the physical erasing units if the off time is longer than an off time threshold.

18. The memory storage apparatus as recited in claim 17, wherein the memory control circuit unit is further configured to obtain a total off time previously recorded and to calculate a sum of the off time and the total off time if the off time is not longer than the off time threshold, wherein the memory control circuit unit is further configured to perform the refresh operation on the physical erasing units if the sum of the off time and the total off time is longer than the off time threshold, wherein the memory control circuit unit is further configured to reset the total off time after performing the refresh operation on the physical erasing units.

19. The memory storage apparatus as recited in claim 18, wherein the memory control circuit unit is further configured to update the total off time via the sum of the off time and the total off time if the sum of the off time and the total off time is not longer than the off time threshold, and to store the updated total off time in at least one of the physical erasing units.

20. The memory storage apparatus as recited in claim 17, wherein the memory control unit is further configured to continue to record a refresh operation interval time after performing the refresh operation on the physical erasing units; and, wherein the memory control circuit unit is further configured to perform the refresh operation on physical erasing units if the refresh operation interval time is longer than an interval time threshold.

21. The memory storage apparatus as recited in claim 17, wherein the memory control circuit unit further comprises an error checking and correcting circuit, wherein the memory control circuit unit is configured to issue a read command sequence to read a valid data stored in a first physical erasing unit among the physical erasing units, and the valid data of the first physical erasing unit is checked by the error checking and correcting circuit, wherein the memory control circuit unit is further configured to calculate a number of error bits of the valid data of the first physical erasing unit, wherein the memory control circuit unit is further configured to copy the valid data of the first physical erasing unit into a second physical erasing unit of the physical erasing units if the number of error bits of the valid data of the first physical erasing unit is greater than a predetermined error bit number threshold, wherein the memory control circuit unit does not copy the valid data of the first physical erasing unit into the second physical erasing unit of the physical erasing units if the number of error bits of the valid data of the first physical erasing unit is not greater than the predetermined error bit number threshold.

22. The memory storage apparatus as recited in claim 21, wherein the physical erasing units belong to a system area of the rewritable non-volatile memory module.

23. The memory storage apparatus as recited in claim 17, wherein the memory control circuit unit is further configured to record the shutdown time in one of the physical erasing units of the rewritable non-volatile memory module, wherein the shutdown time is recorded before the memory storage apparatus is powered off.

24. The memory storage apparatus as recited in claim 23, wherein the memory control circuit unit is further configured to read the shutdown time from the one of the physical erasing units of the rewritable non-volatile memory module if the memory storage apparatus is powered on.

* * * * *